US008960185B2

(12) United States Patent
Ashkin

(10) Patent No.: US 8,960,185 B2
(45) Date of Patent: Feb. 24, 2015

(54) COMPOUND COLLECTOR SYSTEM FOR SOLAR ENERGY CONCENTRATION

(76) Inventor: Arthur Ashkin, Rumson, NJ (US)

( * ) Notice: Subject to any disclaimer, the term of this patent is extended or adjusted under 35 U.S.C. 154(b) by 509 days.

(21) Appl. No.: 13/324,515

(22) Filed: Dec. 13, 2011

(65) Prior Publication Data

US 2012/0138047 A1 Jun. 7, 2012

Related U.S. Application Data

(63) Continuation-in-part of application No. 12/631,468, filed on Dec. 4, 2009, now Pat. No. 8,546,686.

(60) Provisional application No. 61/176,748, filed on May 8, 2009.

(51) Int. Cl.

| | |
|---|---|
| ***F24J 2/34*** | (2006.01) |
| ***G02B 5/10*** | (2006.01) |
| ***F24J 2/10*** | (2006.01) |
| ***H01L 31/052*** | (2014.01) |
| ***G02B 19/00*** | (2006.01) |

(52) U.S. Cl.

CPC ........ *H01L 31/0522* (2013.01); *G02B 19/0019* (2013.01); *G02B 19/0042* (2013.01); *H01L 31/0525* (2013.01); *Y02B 10/20* (2013.01); *Y02E 10/52* (2013.01)

USPC ............ 126/680; 126/684; 126/685; 359/853

(58) Field of Classification Search

CPC ......... Y02E 10/43; Y02E 10/45; F24J 2/0015

USPC ............................................... 126/680; 429/9

See application file for complete search history.

(56) References Cited

U.S. PATENT DOCUMENTS

| | | | | |
|---|---|---|---|---|
| 3,647,358 A * | 3/1972 | Greenberg | ................. | 423/210.5 |
| 4,088,121 A * | 5/1978 | Lapeyre | ........................ | 126/606 |
| 4,326,012 A * | 4/1982 | Charlton | ........................... | 429/9 |
| 4,637,376 A * | 1/1987 | Varney et al. | ................. | 126/682 |
| 4,643,168 A * | 2/1987 | Butler | .......................... | 126/650 |
| 4,863,224 A | 9/1989 | Afian et al. | | |
| 4,963,012 A * | 10/1990 | Tracy et al. | ................... | 359/514 |
| 5,865,905 A | 2/1999 | Clemens | | |
| 6,252,155 B1 * | 6/2001 | Ortabasi | ....................... | 136/246 |
| 6,274,860 B1 | 8/2001 | Rosenberg | | |
| 6,276,359 B1 | 8/2001 | Frazier | | |
| 6,666,207 B1 | 12/2003 | Arkas et al. | | |
| 6,903,261 B2 | 6/2005 | Habraken et al. | | |
| 7,164,839 B2 | 1/2007 | Nyhart, Jr. et al. | | |
| 2002/0007845 A1 | 1/2002 | Collette et al. | | |
| 2006/0201498 A1 * | 9/2006 | Olsson et al. | ................. | 126/605 |
| 2007/0029208 A1 * | 2/2007 | Withers et al. | ................ | 205/367 |
| 2008/0184990 A1 | 8/2008 | Tuchelt | | |
| 2008/0185034 A1 | 8/2008 | Corio | | |
| 2008/0223443 A1 | 9/2008 | Benitez et al. | | |

* cited by examiner

*Primary Examiner* — Alissa Tompkins
*Assistant Examiner* — Benjamin W Johnson
(74) *Attorney, Agent, or Firm* — Wendy W. Koba

(57) ABSTRACT

A solar collector is formed as a compound arrangement of a multiple number of tapered, pyramidal-type structures. This forms an N-stage solar collector, each stage providing a degree of concentration and thus forming an arrangement that is smaller than a single stage collector (while achieving the same amplification factor). The stages are arranged in tandem along a common optical axis, with the output of the first stage becoming the input for the second stage, and so on. It was found that a reduced number of reflections is required, reducing the loss of the overall system.

12 Claims, 17 Drawing Sheets

BEAMLET ONE RELECTION
+C3
+2b
+C2
BEAMLET $\frac{L}{D}=1$
BEAMLET TWO REFLECTION
+C1
+1b
+C2
C1
+2b
+C2
+1b
+C3
22
60°
$\frac{L}{D}=1$
$\frac{L}{D}=1.5$
60°
45°
15°
C2
45°
14
18
30°
30°
$\frac{L}{D}=2$
20
CA
$\frac{L}{D}=3$ $\alpha_3 = 7.5°$
$\alpha_3 = 7.5°$
200
$\alpha_2 = 4.5°$
$\alpha_2 = 4.5°$ 210
$\alpha_1 = 3°$
$\alpha_1 = 3°$
205

COMPOUND COLLECTOR SYSTEM FOR SOLAR ENERGY CONCENTRATION

CROSS-REFERENCE TO RELATED APPLICATIONS

This application is a continuation-in-part of U.S. application Ser. No. 12/631,468, filed Dec. 4, 2009, which claims the benefit of U.S. Provisional Application No. 61/176,748, filed May 8, 2009 and herein incorporated by reference.

TECHNICAL FIELD

The present invention relates to a solar energy collection system and, more particularly, to a compound solar collector comprising a system of at least two concatenated collectors of a preferred tapered geometry that allows for significantly improved concentration efficiency, while also relaxing the requirements on tracking the movements of the sun; the inventive system also provides a means of reducing energy generation costs well below those associated with my previously-disclosed single stage pyramidal collectors, as well as those associated with a single pyramidal collector or standard fossil fuels.

BACKGROUND OF THE INVENTION

Most present day energy usage is derived from the sun. This comes largely from the burning of fossil fuels. Such usage has caused vast environmental problems, starting from as early as the Industrial Revolution and continuing today at an almost unabated pace. Indeed, the subsequent neglect of these growing problems has given rise to the present-day situation, calling for rapid remediation on the scale of a few years.

Direct use of solar energy in photovoltaic (PV) and thermal systems is probably the most desirable—yet least used—of the so-called "green technologies" under consideration for overcoming environmental problems for home, industrial and/or large-scale usage. High construction costs and the difficulty of achieving high solar cell efficiencies are the principal factors in preventing the extensive use of most presently-available systems. Most efforts to reduce costs of solar systems are centered on improving the efficiency and cost of the solar cells themselves. For example, extensive work is underway on improving cells made of single crystal silicon and other PV materials (such as, for example, plastic films based on polysilicon, organic PV material, inorganic PV material, and the like). New physical properties, such as large charge multiplication and high voltage charge extraction, are also being studied. The present cost of production of the best solar PV cells is approximately $2-$5 per watt, which is prohibitive when compared with a current cost of about $0.50 per watt for coal, the least expensive of the fossil fuels. Often, government subsidies attempt to make up the difference in cost in order to promote alternative solar usage.

Most current solar systems for residential or business use are based on large arrays of planar, flat-plate solar PV panels set out on rooftops. Also, thin-film PV systems are being tested on vast stretches of desert floor for large-scale power plant use, for example. The flat-plate design requires that the active area of the collector be essentially equal to the area of the PV material exposed to one sun radiation. That is, there is a one-to-one ratio of active collector area to PV cell area. The production cost of a one-sun flat plate module is mostly governed by the cost and efficiency of the PV material that is used to cover the active module area. Therefore, in order to reduce the cost of a flat-plate module, the PV base material must be made less expensive, or more efficient, or both. Many organizations are investigating thin-film photovoltaic technologies to address the issue of lowering the cost of the PV base material. All thin-film approaches thus far have lowered the cost of the PV material, but at the expense of module efficiency.

Other approaches to achieve solar generation involve use of solar concentrating systems. These systems generally use parabolic mirror collectors or Fresnel lenses in various configurations to focus and concentrate the sun's light onto small-area PV cells, or fluid-filled thermal absorbers for driving turbines or other heat-generating systems. The concentration ratio is defined as the input power: output power and in these designs may vary from 1.5:1 to over 1500:1. Traditionally, design approaches for concentrating collectors have been large and bulky, using Fresnel lenses or large area parabolic reflectors. These arrangements have large single-element focusing optics, requiring highly accurate and expensive feedback-controlled solar tracking mechanisms.

One exemplary prior art solar concentrator that addresses some of these concerns is described in U.S. Pat. No. 6,276,359 issued to S. Frazier on Aug. 21, 2001. The Frazier arrangement comprises a "double reflecting" solar concentrator that utilizes a primary parabolic reflective surface in combination with a secondary reflective surface. The incident light reflects off the secondary surface away from the primary parabolic surface's natural focus point toward a second focal point positioned on (or substantially near) the surface of the primary parabolic reflective surface. This optical path results in a narrower field of view at the receiver, which can improve the costs of some PV arrangements. The high cost of the pruir arrangement is due to the small acceptance angle, however, remains limited in terms of the angle of acceptance of the incoming radiation and the need to accurately track the movement of the sun to provide a practical arrangement.

U.S. Pat. No. 6,666,207 issued on Dec. 23, 2003 to E. Arkas et al. discloses a solar concentrator formed into the shape of a spiral horn, where the horn is adapted to concentrate, by multiple reflections from the internal light-reflecting surface of the horn, solar energy incident within a predetermined range of angles. In particular, a preferred embodiment of the Arkas et al. design utilizes a spiral horn having the geometry of the well-known "Golden Spiral". While potentially interesting from a design point of view, the formation of such a spiral horn had extensive manufacturing difficulties which make it a cost-prohibitive option.

Long parabolic troughs are used in many conventional solar collector systems, where only the elevation is feedback-controlled (that is, azimuthal control is not a concern). The design of such a trough system is based on a technique called "non-imaging optics". This type of analysis considers principally the power concentration features of solar collectors and totally neglects the imaging features which can often be complex and highly aberrated. Also, the large physical size of the solar trough systems is a major contribution to the high cost of such arrangements.

The state of the art approaches have not adequately addressed the issues of optical efficiency, optical cost, heat dissipation, solar tracking tolerance and size and weight concerns. Although interest in solar energy usage is high, experts predict it will take years (varying from a few years to a few decades) and large investments of capital and possibly government subsidies to significantly reduce our dependence on fossil fuels.

SUMMARY OF THE INVENTION

The present invention addresses the needs remaining in the prior art and discloses a new type of compound solar collector system that is capable of converting solar energy into electrical energy and heat at a very low cost and high efficiency.

A solar collector has been formed in accordance with the present invention comprises a compound collector system formed of a plurality of concatenated collectors, each of which utilizes multiple internal reflections of light passing down a tapered, pyramidal-type structure made of highly-reflective and planar mirrored surfaces. In particular, right-angled truncated reflective pyramidal structures have been discovered to have many properties which make them much superior to existing concentrator geometries. By concatenating at least two of these collectors in a compound configuration a multiplicative effect in increased efficiency has been achieved.

It has been discovered that the use of a tapered, pyramidal-type structure creates multiple reflections which appear at the collector output in the form of a Buckminster-Fullerene display, providing improved collector efficiency and amplification, while being much less expensive than prior art concentrators of the Fresnel lens or parabolic type.

It is an advantage of the solar collector system of the present invention that the truncated pyramidal collector is less sensitive to the movement of the sun than the prior art conventional arrangements. In particular, the truncated pyramidal collector of the present invention is more than an order of magnitude less sensitive to the sun's acceptance angle than parabolic and other lens-like collectors. This insensitivity to acceptance angle eliminates the need for the above-mentioned expensive two-axis (or single-axis, feedback-controlled) tracking apparatus as required for use with conventional parabolic collectors (which are known to be extremely sensitive to small collector misalignments). In accordance with the present invention, only low-cost crude tracking of the general movement of the sun is required.

Additionally, the reduced sensitivity to acceptance angle allows for the system of the present invention to operate at quite high efficiency even under cloudy or hazy skies. These are conditions where parabolic collectors are at their poorest. In particular, it has been observed that the truncated pyramidal collector of the present invention can exhibit increased collection levels under hazy conditions, as a result of increased scattering of light within the haze coupled with the structure's ability to capture the scattered rays and reflect them towards the solar receiver. This can result in a significant increase in collected power over conventional solar parabolic systems. Moreover, the wide acceptance angle of the inventive arrangement allows for the collectors themselves to be relatively "low precision" devices—tolerant of flaws in collector geometry, such as distortions from rippled mirror surfaces. Indeed, these types of flaws often cause conventional systems to operate at reduced efficiency.

It is another advantage of the present invention that the tapered pyramidal geometry of planar, mirrored sidewalls is significantly less expensive to manufacture and implement than the prior art "spiral horn" arrangement described above. Indeed, the square-based truncated pyramidal solar collector embodiment of the present invention can be formed as a ziggurat-like (or "modified" ziggurat-like) structure that is lightweight and inexpensive. This modified ziggurat structure consists of four planar mirrors held in place by a pair of wire ringlets that fit over the structure and are attached to the outside of the mirrors to prevent them from falling inward (or outward), just as in the standard ziggurat structure described below. The circular conic embodiment of the present invention is readily fabricated for relatively small dimensions (such as may be utilized in residential applications), but may be more difficult in larger sizes—where any of the multi-sided truncated pyramidal arrangements (triangular, square, rectangular, pentagonal, or the like) may be more appropriate.

In accordance with this new aspect of the present invention, a compound collector system is proposed that comprises two or more collectors formed in the manner described above and axially aligned in tandem. The axial alignment can be achieved using a single, internally fitting, alignment jig that holds the various stages in proper alignment so that they can be simply attached to each other. As described in detail below, each 'stage' in the compound configuration is attached to the previous stage and has a taper angle greater than that associated with the previous stage. The utilization of a compound geometry has been found able to reduce the overall length of a single stage collector of the present invention, while able to collect as least as much energy as the single stage embodiment.

The compound collector system of the present invention is considered to be suitable for use in a variety of applications—in homes, businesses, industrial, or the like—and is considered to be a ubiquitous product in that regard. The relatively small size of the compound collector (compared to a single stage configuration) makes it a particularly attractive option for residential use. Indeed, the compound collector of the present invention may be used as part of system for charging electric vehicles, desalination of ocean water, "scrubbing" unwanted particulate from the air (e.g., a $CO_2$ scrubber). Other and further advantages and aspects of the present invention will become apparent during the course of the following discussion and by reference to the accompanying drawings.

BRIEF DESCRIPTION OF THE DRAWINGS

Referring now to the drawings,

FIG. 1(*b*) is a variation of the collector of FIG. 1(*a*), in this case being of conic form with a circular geometry input and output face;

FIG. 4(*b*) depicts the normalization applied to the ratio of the input and output faces of the collector of FIG. 1(*a*);

DETAILED DESCRIPTION

Figure 1A:
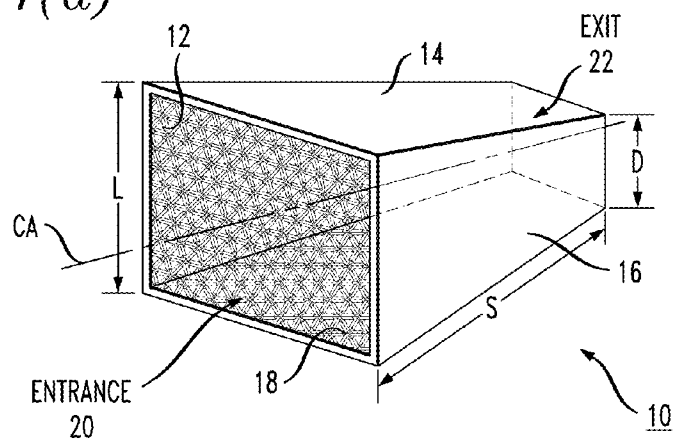
FIG. 1(*a*) shows a right-angled, truncated pyramidal solar collector formed in accordance with the present invention, having a square geometry input and output face.
Figure 1B:
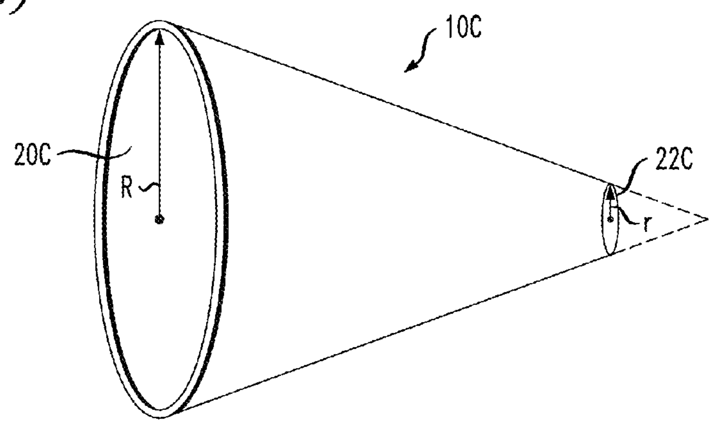

A novel way of concentrating radiant energy using multiple reflections of light passing down a tapered pyramidal-type structure made from highly-reflective mirrored surfaces is the subject of the present invention. It has been discovered that tapered structures such as these have many properties that make them not only useful, but superior to existing solar collectors. FIG. 1(*a*) illustrates an exemplary embodiment of a single stage right-angled truncated pyramidal solar collector 10 formed in accordance with the present invention. In this case, collector 10 utilizes a square geometry entrance port and exit port, with tapered reflective sidewalls disposed therebetween. That is, collector 10 is formed of a set of four tapered, planar reflective sidewalls 12, 14, 16 and 18. Collector 10 is shown as having an entrance 20 of dimension L (and area, therefore, of $L^2$). Collector 10 has a length S, tapering downward to an exit 22 of dimension D (and area of $D^2$). Although not explicitly shown, it is to be understood that in implementation, a transparent covering is placed over entrance 20 to prevent rain, snow, debris, etc. from entering collector 10 and obstructing its reflective properties.

In accordance with the present invention, parallel light rays, such as from the sun, enter a single stage collector 10 within an acceptance angle that transports all of the rays at entrance 20 toward exit 22, propagating along collector axis CA. Depending on the angle of the incoming rays with respect to axis CA, they will make a number of reflections of increasing angle with respect to mirrored surfaces 12, 14, 16 and 18 as they proceed down the length of concentrator 10 to exit 22. At exit 22, the rays are concentrated and collected by a PV panel or a thermal absorber (not shown). This optical behavior is similar to the "walk-off" that occurs in misaligned planar mirrors in open laser resonators. This behavior can also be thought of as a version of the "barber-shop effect" when two slightly tilted mirrors on opposite walls of barber shop reflect multiple images. Another very useful way of viewing this reflective behavior is as a simple application of *Fermat's Principle of Least Time* in which each ray follows a single straight line path from a "virtual sun" source to the output face. Each "virtual sun" is a mirror image of the real sun, located the same perpendicular distance behind the reflecting mirror, as the real sun is in front of the mirror.

Figure 2:
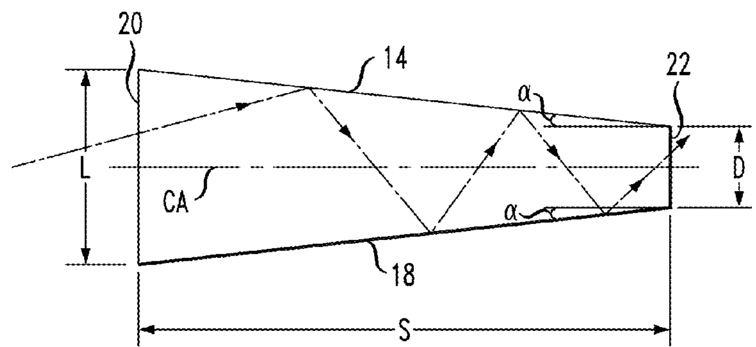
FIG. 2 is a cut-away side view of the collector of FIGS. 1(*a*) and (*b*), taken along collector axis CA.

FIG. 2 is a cross-sectional side view of collector 10, illustrating the parameters L, D and S and showing the relationship that is used to configure the concentrator in accordance with the present invention. The angle α is defined as the taper angle of the collector sidewalls with respect to the collector axis CA. As shown, the four parameters L, D, S and α are used to define the geometry of the truncated, right-angled pyramidal collector based on a square-shaped input of area $L^2$ and a square-shaped output of area $D^2$. Indeed, the length S is defined by the geometry as:

$$S = \frac{\left(\frac{L}{2} - \frac{D}{2}\right)}{\tan\alpha}. \quad (1)$$

Using this relation, it is possible to calculate any parameter of the collector given the other three. Alternatively, characteristics of the collector's behavior can be determined by, for example, by holding one of the parameters and allowing the others to vary.

Figure 3:
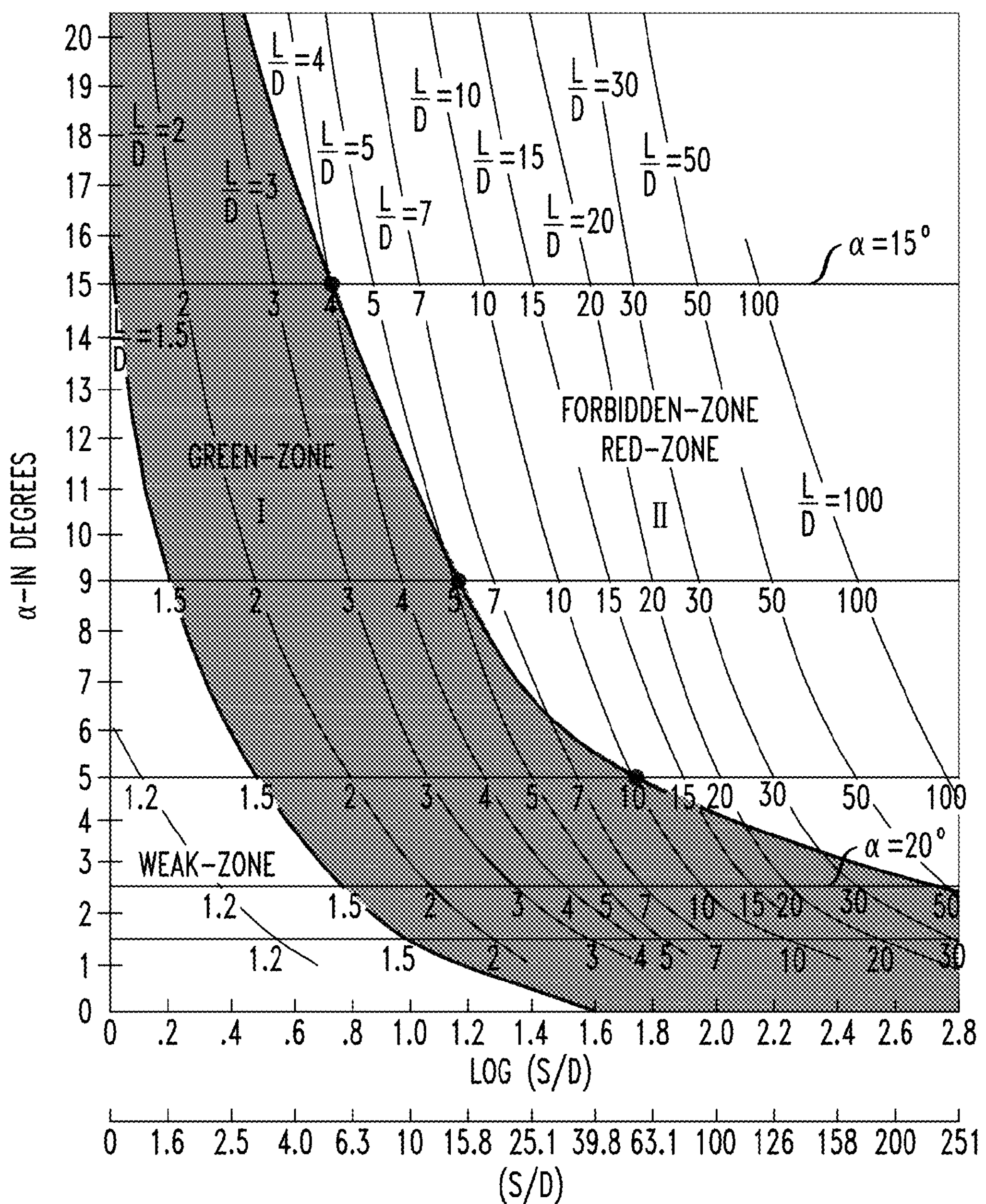
FIG. 3 is a master diagram derived from the geometry of the solar collector of FIG. 1(*a*)

FIG. 3 is the master diagram, basic to the understanding of the present invention, illustrating the relationship between the parameters as shown in equation (1). In the master diagram of FIG. 3, the parameter a is shown along the y-axis; the quantities (S/D) and log (S/D) are displayed on the x-axis. By selecting different values of (L/D), the corresponding values of α can be computed from equation (1). These values are plotted as a series of curves showing all possible collector parameters for each of these chosen values of (L/D). This master diagram is the basis used to derive a preferred set of structural dimensions forming the collector of the present invention. It is to be understood, however, that the master diagram of FIG. 3 is associated with the particular geometry of square-based collector 10 of FIG. 1(*a*). When using other collector geometries (i.e., triangular-based truncated pyramid, pentagon-based truncated pyramid, or the like), a different set of relationships will be created and used to determine a preferred set of dimensions L/D, S and α. For example, FIG. 1(*b*) illustrates an alternative collector 10C of the present invention, formed of a conic structure with a circular entrance 11 of radius R and area $\pi R^2$ and a circular exit 13 of radius r and area $\pi r^2$. As shown, entrance 12 of the arrangement of FIG. 1(*a*) can be inscribed within entrance 11 of collector 10C. Indeed, for a conical collector with a circular cross-section, the incoming rays making an angle with respect to the axis will spiral about the axis and give rise to a ring-type pattern of images emerging from circular exit 13.

The collection efficiency, or amplification factor A, is given by $(L/D)^2$ for the arrangement of FIG. 1(*a*), assuming that all the power entering collector entrance 20 (defined by area $L^2$) passes through collector exit 22 (defined by area $D^2$). In the master diagram of FIG. 3, the (L/D) values range from approximately one to one hundred, with an amplification A of approximately ($1\text{-}10^4$) for values of α of approximately (1°-20), with (S/D) values ranging from (0-600).

For a given value of α, the master diagram of FIG. 3 shows that there is only a limited range of possible collector geometries for which there is no reflection of any input power. This fact implies that there are two zones: a first zone, shaded and labeled "I" in the master diagram of FIG. 3, in which all of the input power is concentrated by the collector and exits through collector exit 22, and a second zone, labeled "II", in which an increasing fraction of the input power is retro-reflected back out through collector entrance 20. For some collectors, not all of the input power exits the collector but instead is retro-reflected back out through collector entrance 20. This is due to the fact that for these collectors the many reflections that occur as the light proceeds down the collector can increase in angle with respect to axis until it exceeds 90°, at which point it retro-reflects. This behavior is discussed below in paragraph [0043]. Therefore, the parameters within "zone I" are those which are selected to form collectors in accordance with the present invention. Regardless of the geometry of the entrance/exit of the collector structure (i.e., circular, square, triangular, pentagonal, etc.), there will always be a preferred "zone I" in the associated master diagram where there is no reflection of input power.

Still referring to the master diagram of FIG. 3, a line is drawn across the master diagram at the value α=15°, which illustrates the range of (L/D) values over which zero-reflection, one-reflection, and two-reflection beamlets are generated. In general, additional power output can be obtained with the same dimension D of exit 22, but using a smaller collector angle α. The smaller angle provides a larger amplification by virtue of the fact that larger values of (L/D) occur for smaller angles of α. This then leads to higher power output. This higher power output does come at the expense of a larger length S of collector 10.

For example, with reference to the value of α=2.5°, it can be seen that an amplification of A=2500 can be achieved from an (L/D) value of 50. Theoretically, there is no limit to the amount of power that may be collected. This master diagram is based on a purely geometric optics model where diffraction effects are neglected. Diffraction effects, however are negligible for essentially all pyramidal-type collectors.

Figure 4A:
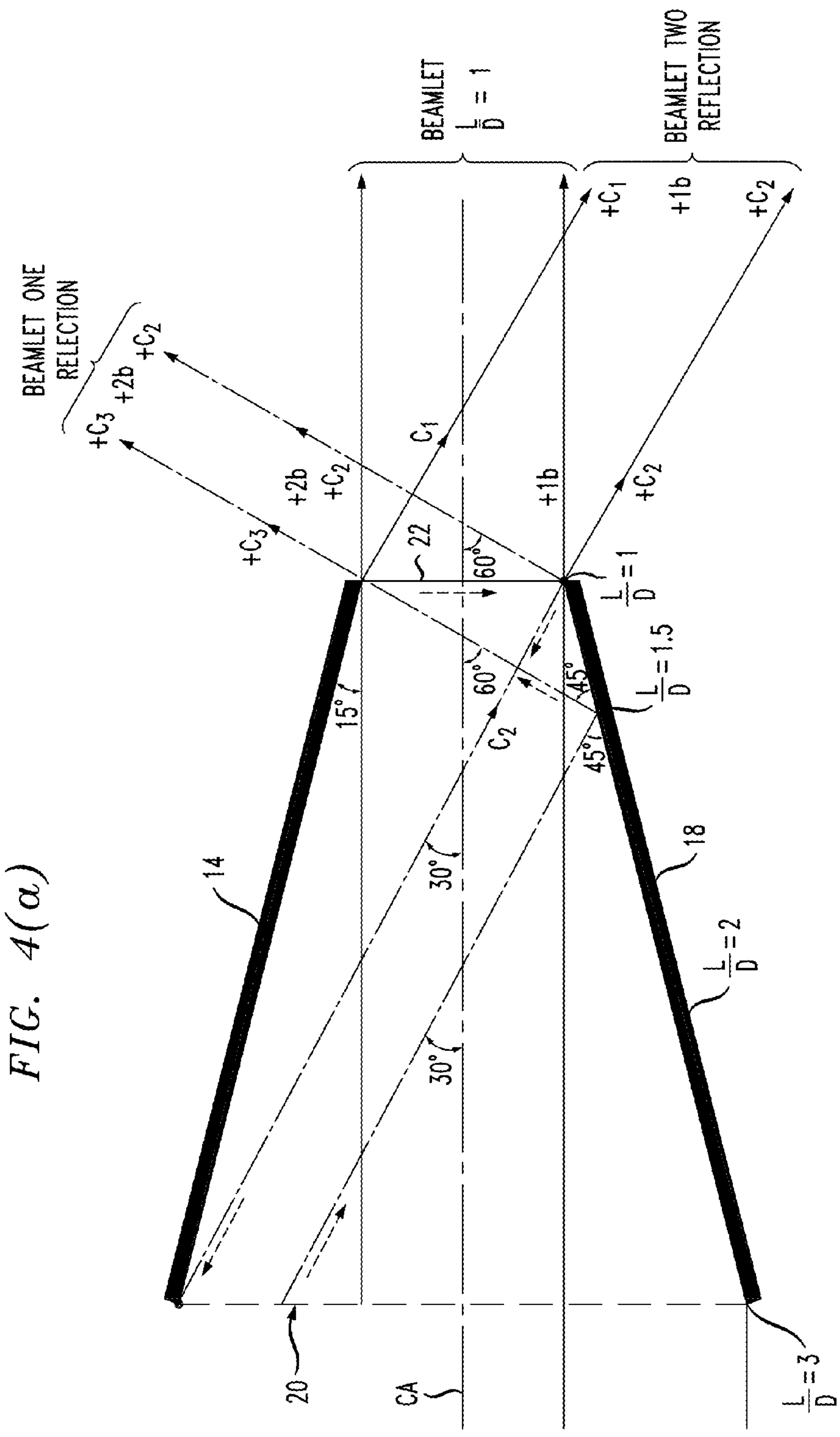
FIG. 4(*a*) contains a diagram showing the paths of various solar rays propagating through the collector of FIG. 1(*a*)
Figure 4B:
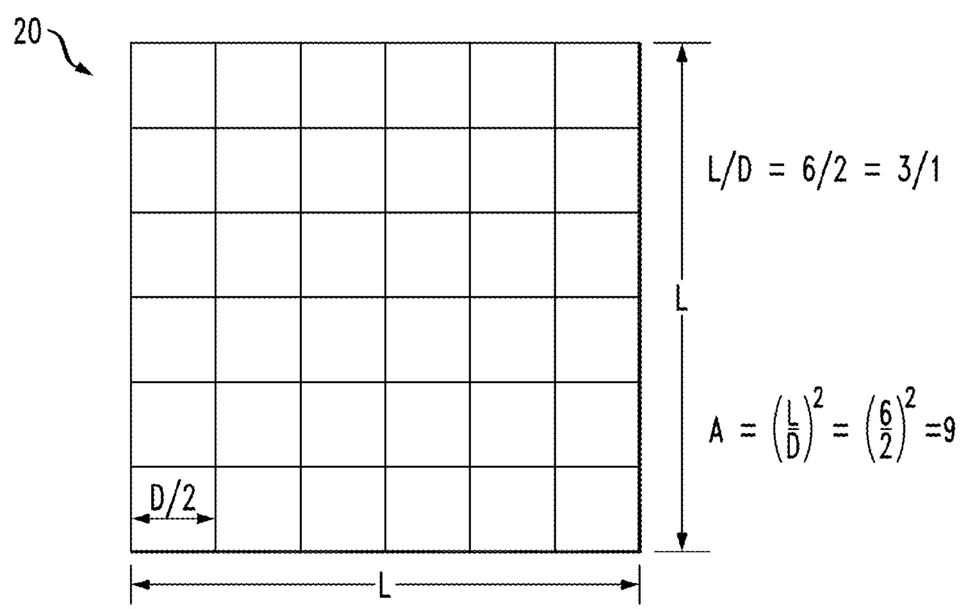
Figure 4B:
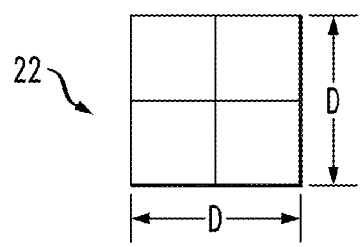

FIG. 4(*a*) is an exemplary diagram of the actual paths of several axial input rays as they pass through a configuration of collector 10 with a taper angle α=15°. A first set rays within the interior portion of entrance 20 that aligns with exit 22 will pass straight through the collector and exit as an undeflected "beamlet", having made zero reflections off of the mirrored surfaces, as shown in FIG. 4(*a*). Another set of rays, immediately outside this first set, will make one reflection along a sidewall (for example, sidewall 18) before exiting collector 10 (for the region between L/D=1 and L/D=2) and are shown in FIG. 4(*a*) as a "one-reflection beamlet". Continuing in a similar fashion, another set of rays will reflect off of two, opposing sidewalls (e.g., sidewalls 14 and 18) of collector 10 before exiting at collector exit 22 as a "two-reflection beamlet" (as shown in FIG. 4(*a*)).

In general, rays entering parallel to collector axis CA make successive reflections at increasing angles of 3α, 5α, 7α, etc. with respect to reflective surfaces 12 and 16. These same rays are also shown in FIG. 4(*a*) as making angles 0, 2α, 4α, 6α, etc. with respect to the collector axis. FIG. 4(*b*) depicts the normalization of L/D=6/2 to 3/1, giving $(L/D)^2=(6/2)^2=9$. The diagrams of FIG. 4(*b*) illustrate entrance face 20, showing the relationship between L and D and the exemplary process used to normalize the ratio of L/D. Keeping in mind the diagram of FIG. 3, it is shown that for an exemplary angle α=2.5 degrees, the ratio L/D=50 in zone I can be reached with an amplification A=2500. Thus, there is no theoretical limit to the amount of power which can be collected from arrangements configured from parameters within zone I of the master diagram of FIG. 3 (preferably, reduced in L/D from the boundary region of zones I and II to minimize absorption and scattering losses). For higher power, one works at smaller angles of α, or simply scales up all collector dimensions for a given collector. In practice, other factors, discussed hereinbelow, should be taken into consideration, as discussed hereinbelow.

Figure 5:
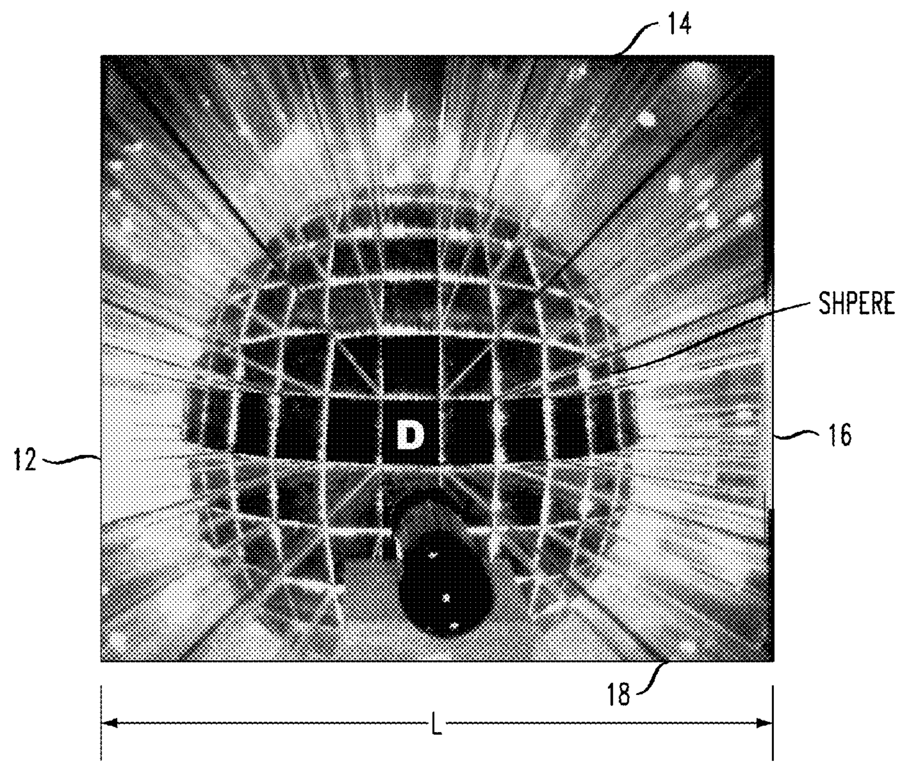
FIG. 5 shows the resulting image from the collector of FIG. 1(*a*), generating a Buckminster-Fullerene-type solar radiation pattern as produced by a single stage solar collector of the present invention. Entering parallel rays that strike the inner Buckminster-Fullerene "sphere" all pass through the output face and are utilized. Entering rays that miss the sphere are all retro-reflected. This aspect of pyramidal collectors provides a useful way of evaluating the performance of the overall collector system.

FIG. 5 is a photographic output image obtained for the arrangement of FIG. 1(*a*), looking through collector 10 from entrance 20 to exit 22. The open innermost square area shown in FIG. 5 (labeled by its dimension "D" in the image) is clearly the illuminated edge of exit 22. The radial ray-like lines arise from the illuminated junction of the four converging reflective sidewalls 12, 14, 16 and 18, which then reflect multiple times in the four sidewalls. The spherical nature of the image itself is an interesting discovery. This behavior had been fully confirmed using a laser pointer to trace along the path of an exemplary light ray and is understood as coming from the multiple reflections of the edges of entrance 20 behaving as a light source. In actuality, the "sphere" is comprised of a multi-sided polygon, formed of many linear segments of smaller size, as described in [0026]. Parallel rays striking the inner Buckminster-Fullerene "sphere" pass through exit 22 and are utilized. Entering rays that miss the sphere are all retro-reflected. Thus, the size of the "sphere" relative to the area of entrance 20 provides an intuitive indication of the amplification factor A associated with collector 10.

Figure 6:
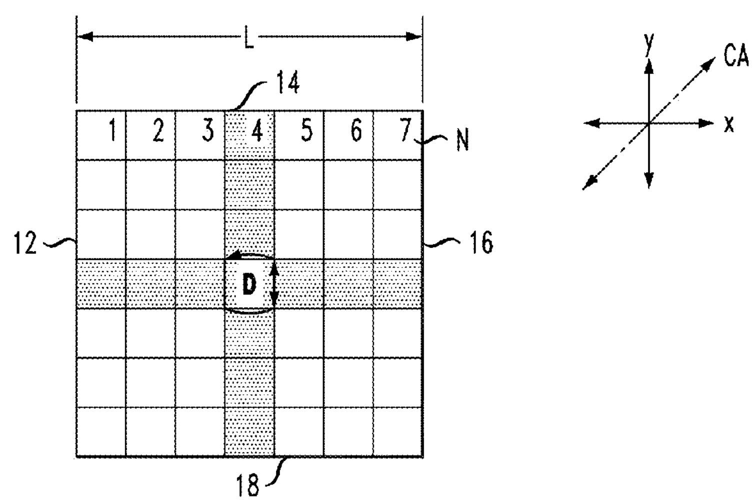
FIG. 6 is a diagram of a solar collector entrance, showing a preferred integral relationship between the area of the collector entrance and the area of the collector exit, as used to obtain a uniform output radiation intensity across the output face of the collector.

By using the pyramidal-type collector of the present invention, uniformity of intensity is achieved by making the ratio of the input face to output face (L/D) an integral value. In this case, the input area $L^2$ can be divided into an N×N array of $N^2$ smaller areas, each of area $D^2$, where with parallel input light each of the $N^2$ sub-areas is imaged onto collector entrance 20. For ideal geometry, this guarantees uniformity of intensity at the output. FIG. 6 is a diagram of collector entrance 20 for the case of N=7, showing the location of all possible input rays. The rays discussed above in association with FIG. 4 are shown as the shaded beamlets in the view of FIG. 6. Of the 49 beamlet regions in this arrangement, the shaded area accounts for 13 of the beamlets. These include the "straight through" beams from the central square (associated with L/D=1) and the other six beamlets diverging along the x and y axes. The remainder of the beamlets will reflect off of all surfaces 12, 14, 16 and 18 and result in a fan of diverging beamlets as they leave exit 22, as shown in FIG. 4(*a*). In this case, the arrangement yields an image including one original sun and 48 "virtual suns". Again, this illustrates the collector efficiency improvement of the present invention over the prior art.

In implementation, there are other factors to be considered which make the use of small angles of α, and the associated large amplification, impractical. In particular, it is unfavorable to have many emerging beamlets exiting collector 10 at large angles with respect to collector axis CA. Such beamlets will strike the absorbing solar cell (or absorbing thermal fluid) at small angles of incidence where surface reflectivity is high. Another undesirable factor is that reflections close to normal incidence will contribute to local heating and scattering loss, while making little or no contribution to amplification (on a per reflection basis).

In contrast, favorable collector parameters may comprise the following values: (L/D)=15, A=225, (S/D)=105 and D=10 cm. These values will yield an L of 1.5 m and a value for S of 10 m, with an input power of 1.5 kW at "one-sun" insulation. To work at yet higher power, additional PV collector units may be added, or all of the collector dimensions scaled upward by the same factor, as mentioned above.

The above analysis has related to the use of pyramidal collectors with rays entering parallel to the collector axis. In the case where the sun's rays enter at an angle with respect to the axis, it can be shown that the collected power falls only slowly over an acceptance angle approaching $2\alpha$. This value of $2\alpha$ is associated with the pyramidal collector geometry of the present invention, and is more than an order of magnitude less sensitive to angle than prior art collector geometries (e.g., Fresnel lenses and parabolas). As a result, the insensitivity to angle eliminates the need for expensive, feedback-controlled two-axis tracking apparatus, as used with conventional solar collector systems (which are extremely sensitive to small collector misalignments, as described above in [0014]).

Instead, a relatively inexpensive two-axis tracker (no feedback required) can be used to orient the inventive collector during the full course of the day while operating at close to full power. Another major attribute of the large collection angle of $2\alpha$ is that the collection system can continue to operate at quite high efficiency—even under cloudy or hazy skies—where parabolic collectors are inoperable. A further benefit of the wide acceptance angle is that the collectors themselves need not be high-precision devices and are tolerant of flaws in collector geometry, such as distortions from rippled mirror surfaces.

Figure 7:
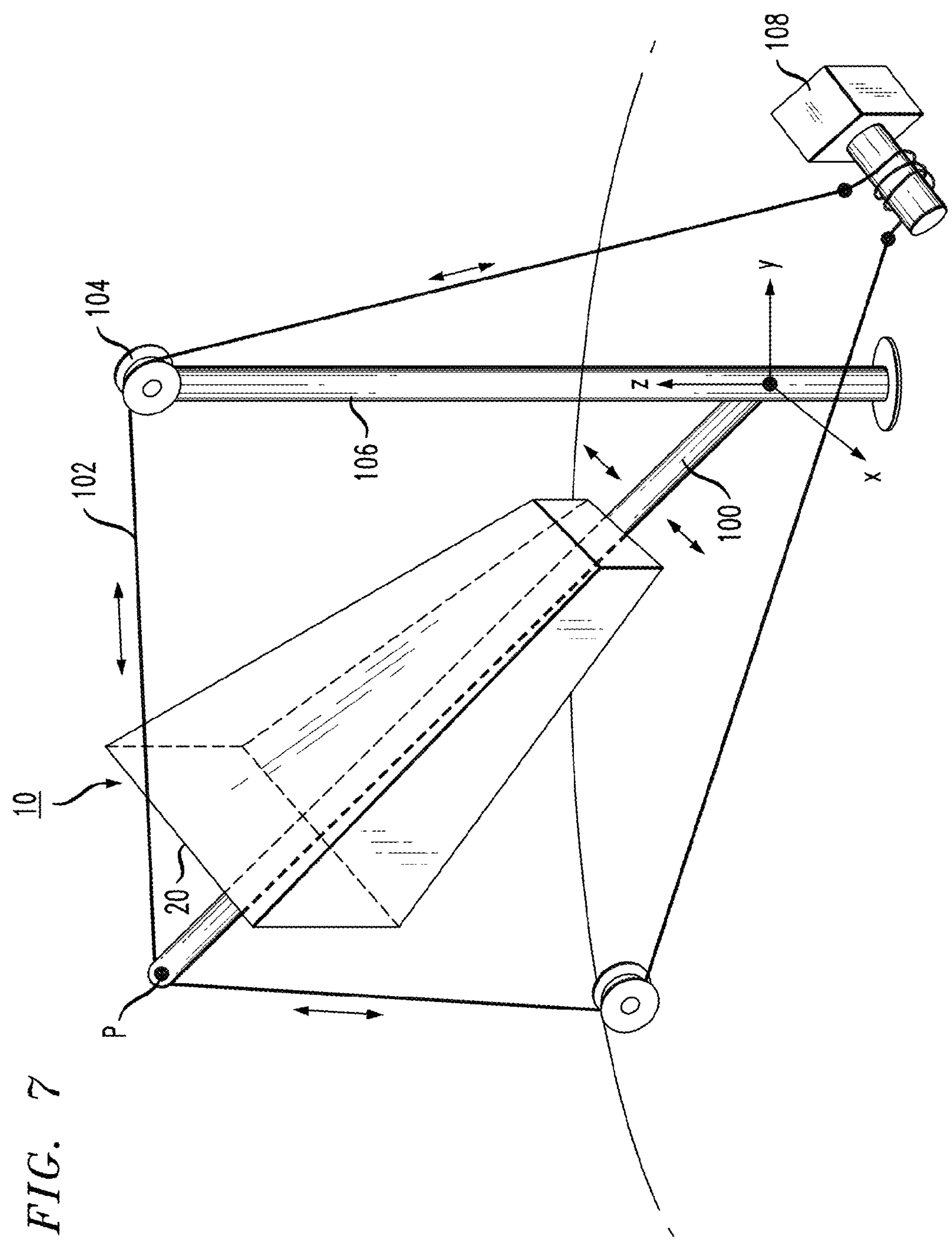
FIG. 7 illustrates an exemplary single stage solar collector of the present invention, mounted on a boom structure to provide simple (i.e., non-feedback) tracking.

In a residential application, a square pyramidal collector, such as collector 10 of FIG. 1(*a*), may be directly mounted onto a house, or located in an area immediately adjacent to the house. FIG. 7 illustrates an exemplary collector 10 mounted onto a boom 100. A first cable 102 is attached to boom 100 at point P, near entrance 20 of collector 10. First cable 102 then passes through a pulley 104 at the top of an associated pole 106. A small motor 108 is connected to first cable 102 at ground level and used to continuously (i.e., no feedback) vary the elevation angle of collector 10 at a constant rate. If pole 106 can itself be rotated about a vertical axis, the aximuthal angle of collector 10 can also be varied using the same motor through a second cable (not shown) to rotate pole 106 about its axis and thus also rotate collector 10. This relatively simple two-axis tracking system is considerably less expensive and complicated than the tracking systems required for conventional solar concentrators based on parabolic reflectors or Fresnel lenses. Moreover, the pyramidal collectors of the present invention are lightweight and inexpensive, requiring only a simple mechanical support structure (indeed, a ziggurat-type structure has been used in construction of an exemplary collector).

Figure 8:
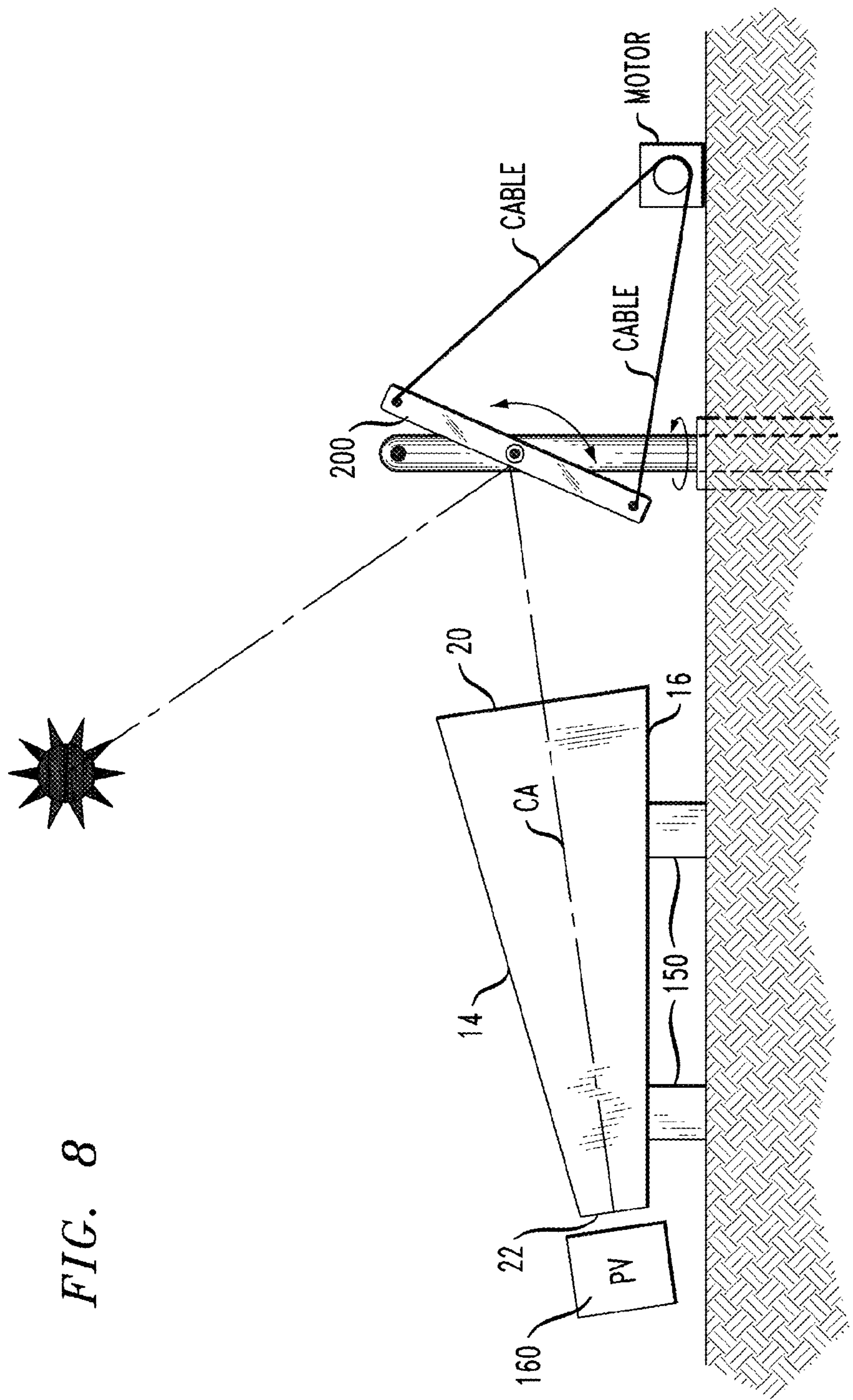
FIG. 8 is an alternative deployment of the inventive single stage solar collector, in this case disposed in a horizontal arrangement and using a secondary mirror to direct the incoming solar rays into the collector's input face.

In situations where space is limited and access is difficult, the collector of the present invention may be disposed in a horizontal configuration with a reflective mirror (having an unobstructed view) disposed at the entrance and used to direct the incoming solar radiation into the collector. FIG. 8 illustrates this particular embodiment. Collector 10 is disposed horizontally, and is slightly raised off the ground by a support arrangement 150 (such as a pair of blocks). A PV/thermal receiver 160 is shown in this embodiment as disposed behind exit face 22 of collector 10, in a position to receive the collected and concentrated solar rays. The separate rotatable mirror 200 is disposed in front of entrance face 20 of collector 10 and is positioned to receive the incoming solar rays and direct them into collector 10, as shown. Similar to the tracking arrangement described above, a simple two-cable and motor system may be used to direct the movement of rotatable mirror 200 to follow the movement of the sun relative to entrance 20 of collector 10.

Figure 9:
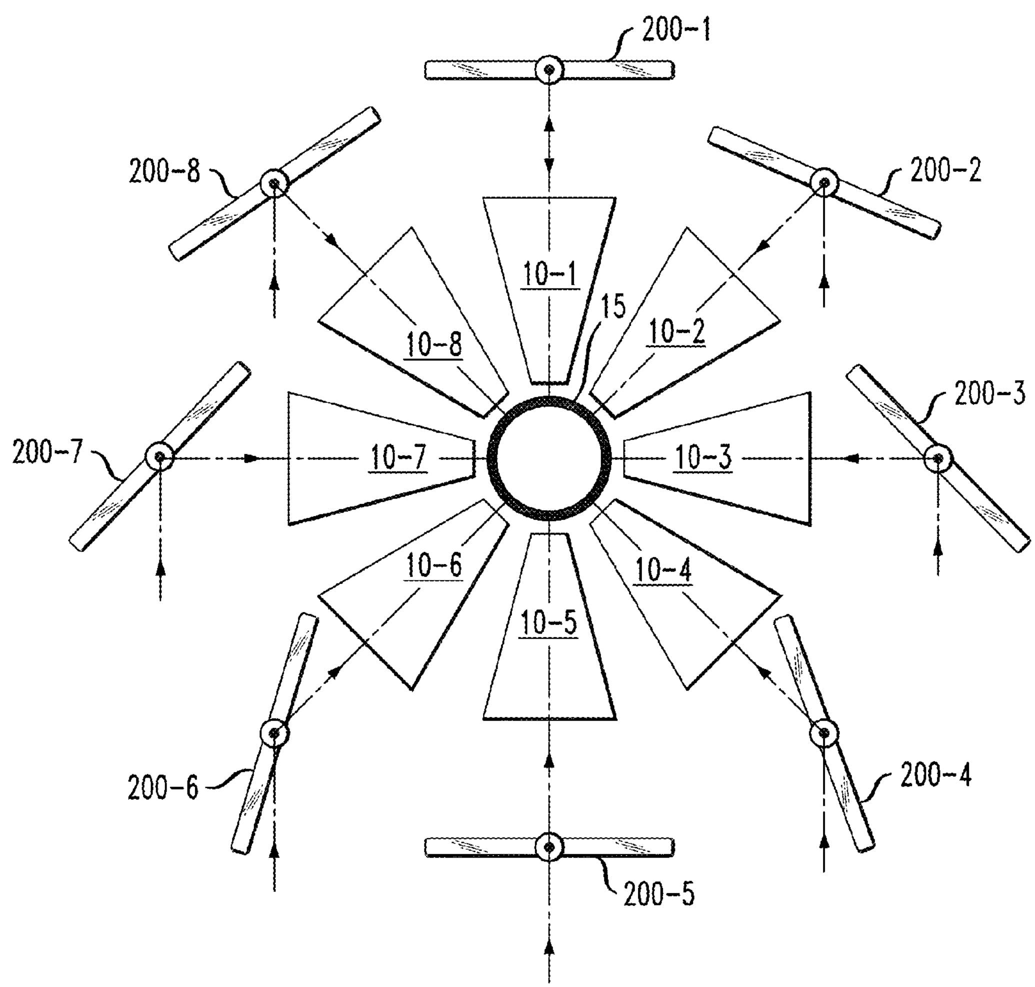
FIG. 9 is an embodiment of the present invention utilizing multiple single stage collectors.

A system useful for implementing a larger number of the inventive collectors is shown in a top view in FIG. 9. As shown, the multiple arrangement includes eight collectors, denoted 10-1, 10-2, 10-8, each with its own feeding mirror 200-1, 200-2, . . . , 200-8. The set of collectors is arranged, in this embodiment, as a "ring", feeding a single PV (or thermal) receiver disposed in the center of the ring. In this particular embodiment, a single length of quartz tubing 155 is efficiently used as a single thermal receiver for the multiple collector arrangement, allowing for continual heating to take place.

Figure 10:
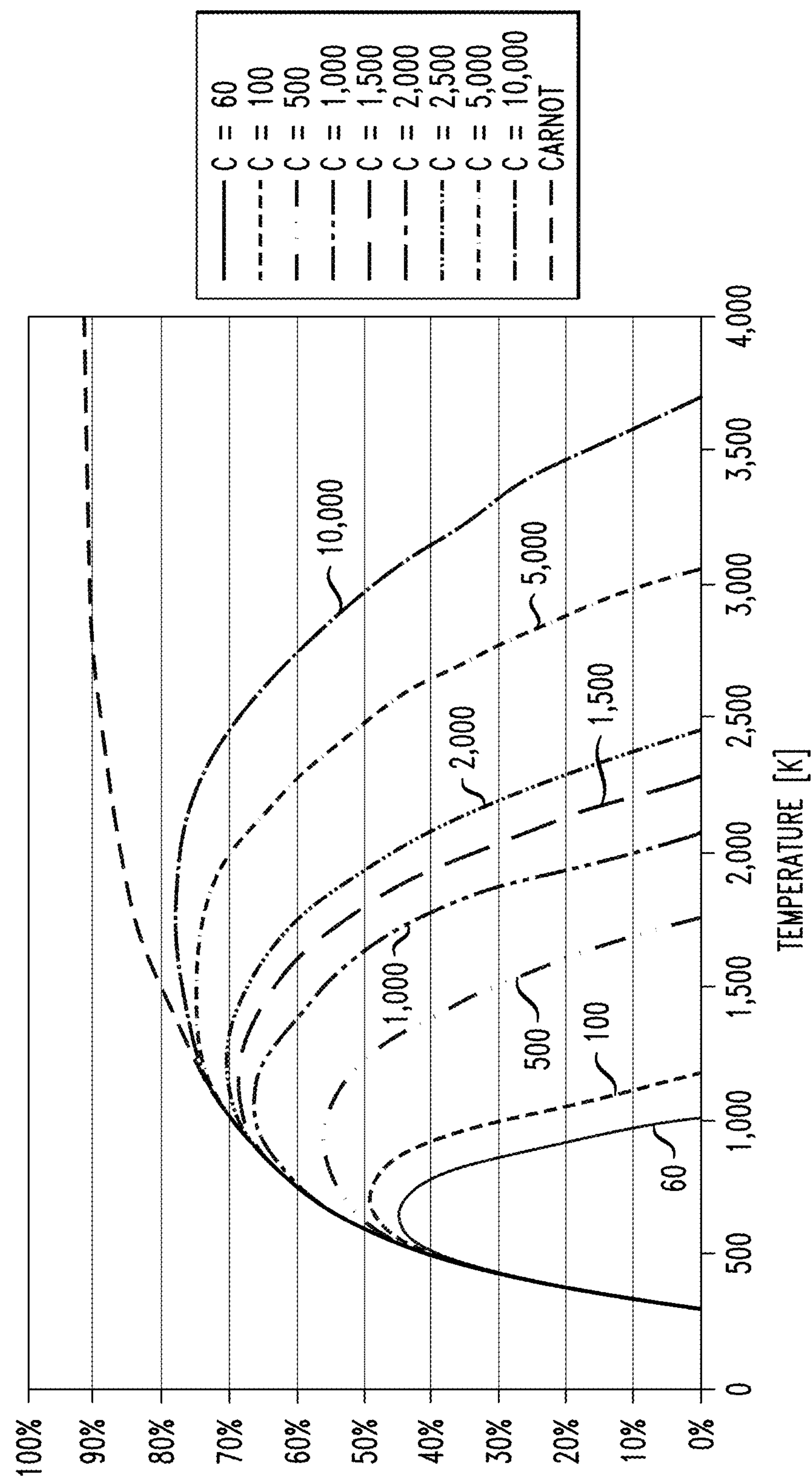
FIG. 10 depicts the ideal thermodynamic power conversion for a solar collector of the present invention.

FIG. 10 depicts the ideal thermodynamic power conversion for a solar collector of the present invention, useful in understanding the efficiencies of the collector of the present invention. In the case of the embodiment of FIG. 9, where the multiple collectors are disposed in a ring arrangement, an amplification factor A in the range of 100-1000, and with a temperature of 700°K, efficiencies between 50% and 70% can be obtained.

Figure 11:
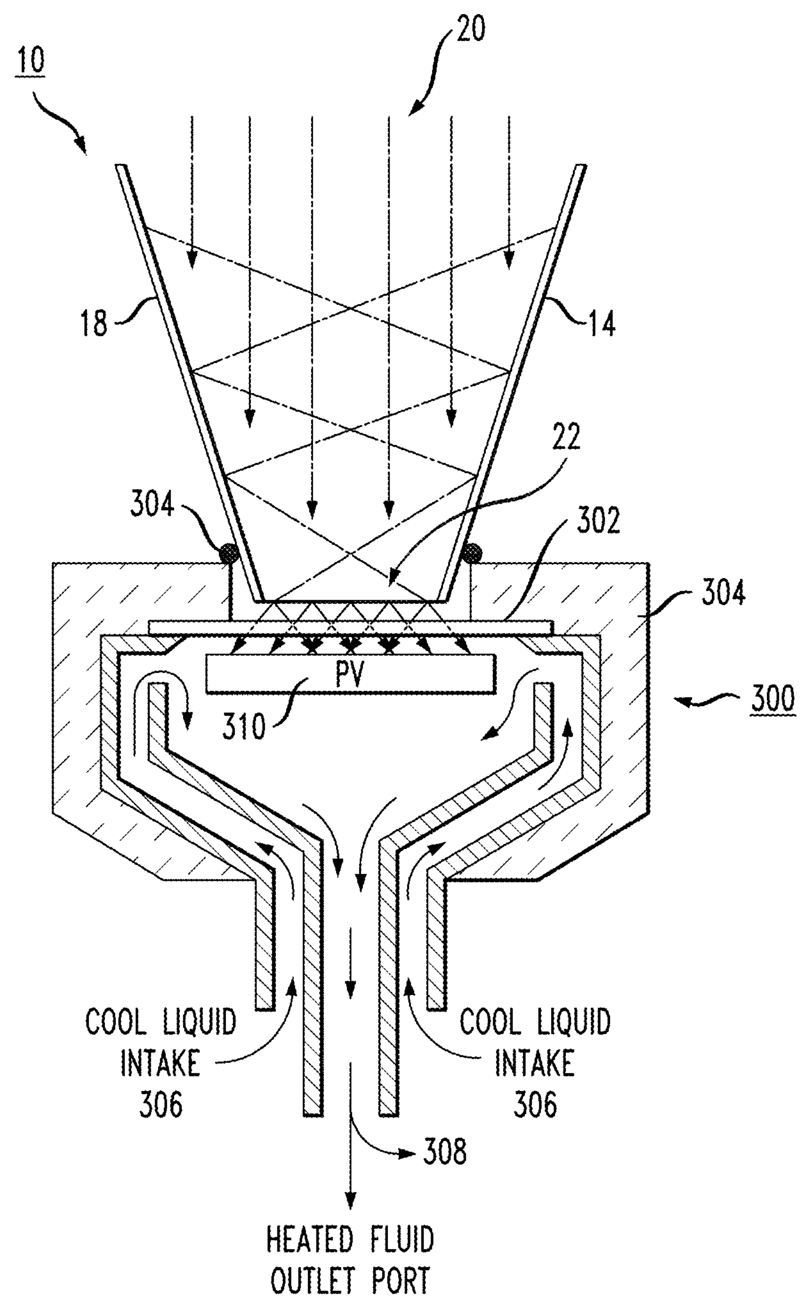
FIG. 11 shows the design of a hybrid PV and hot water system absorption chamber for use with the truncated pyramidal collector of the present invention.

It has been determined that the use of a pyramidal collector in accordance with the present invention provides easy access to heated water, and can make good use of this heat energy to provide building and hot water heat for residences and businesses (since the hot water need only be pumped into a standard water heater for later use). FIG. 11 shows the design of an exemplary hybrid PV and hot water system absorption chamber 300 for use with the truncated pyramidal collector 10 of the present invention. In order to protect the arrangement from the elements, a quartz window 302 is placed across exit face 22 of collector 10, with an O-ring 304 used to seal the connection between collector 10 and absorption chamber 300. In this particular embodiment, an outer insulating housing 304 defines the boundary of chamber 300. Any type of conventional insulative material may be used for this purpose.

In accordance with the operation of chamber 300, an incoming liquid (e.g., water, molten salt, oil, or any other fluid used in thermal systems) enters chamber 300 through inlet tubing 306. In a preferred embodiment, a metal with a high melting temperature (for example, tantalum) is used to form tubing 306. The incoming fluid is then exposed to the solar radiation concentrated by collector 10, is heated, and then flows out through an outlet port 308 in tubing 306. In the formation of this hybrid system, direct electrical energy is created by using a PV cell 310 which is disposed adjacent to quartz window 302. In one embodiment, the molten salt (or other fluid) is held in an insulated thermal energy storage container for later use. For example, the stored molten salt may be used to actuate a scrubbing apparatus for removing contaminating $CO_2$ or other gases from the atmosphere.

It is known that silicon-based PV cells need to be maintained below a temperature of 60° C. to maintain efficient PV generation. When PV cell 310 is operating at a peak efficiency of about 25%, for example, the remaining 75% of the energy will appear as heating and be transferred to the circulating liquid. In the arrangement as shown in FIG. 11, perhaps 80% of this remaining 75% of the energy will be converted to heated fluid. As a result, the exemplary system of FIG. 11 provides a total energy conversion of 25%+(0.8)(75%), or 25%+60%, yielding an overall efficiency of 85%, which is useful for residential and business applications. Indeed, this performance greatly exceeds current solar systems.

In large-scale energy production systems, where high temperature liquids (molten salt, for example) are used, it may be preferable to forego the inclusion of a PV cell (such as cell 310 ), and rely solely on the generation of thermal energy through fluid circulation.

Figure 12A:
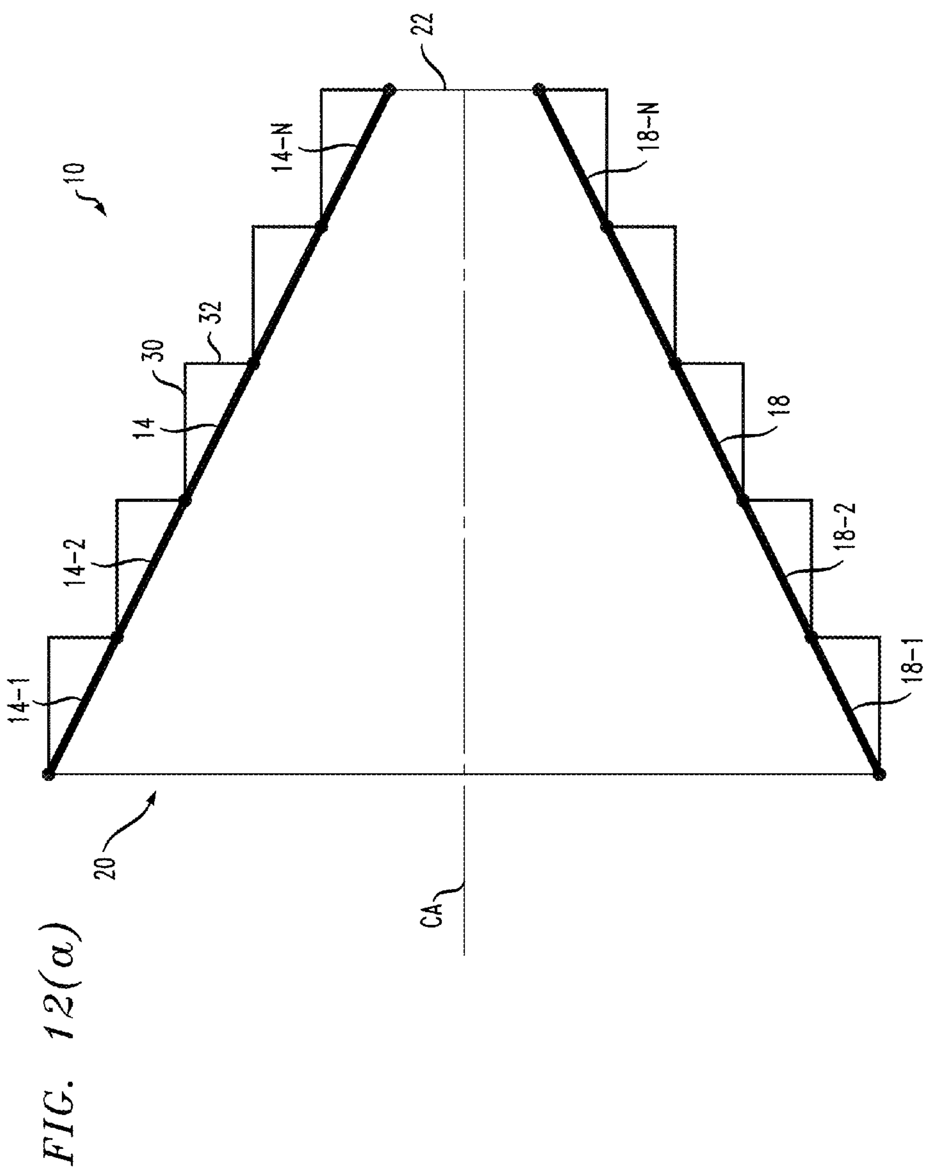
FIG. 12(*a*) is a side view of an exemplary ziggurat-like support structure for use with a square-based truncated pyramidal solar collector, such as shown in FIG. 1(*a*), where FIG. 12(*b*) is an experimental model of the arrangement o FIG. 12(*a*), as seen from the collector entrance and FIG. 12(*c*) is the same experimental model as seen from the collector exit.
Figure 12B:
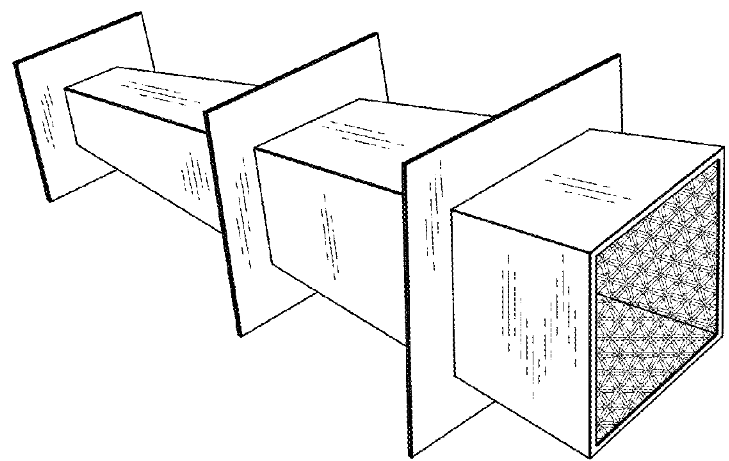
Figure 12C:
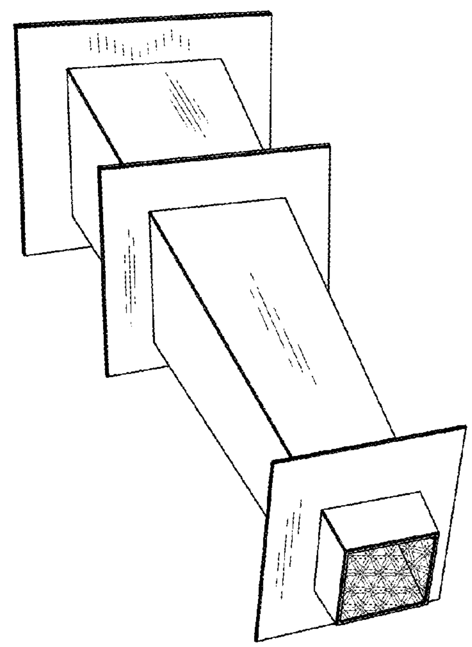

As mentioned above, the specific embodiment of the present invention illustrated in FIG. 1(*a*) may be fabricated in a ziggurat-like construction technique that creates a rigid, yet lightweight, structure of the kind needed for low-cost pyramidal collectors. FIG. 12(*a*) shows an exemplary ziggurat-like pyramidal collector. There are known problems associated with the fabrication of such pyramidal structures. However, using thin, flexible, silvered foils (approximately 0.010" thick) for the flat mirrors, and a 0.07" aluminum roof flashing (or thin plywood) as backing material, it is possible to make quite high quality mirrors with low distortion.

As shown in FIG. 12(*a*), cross-bars 30 are attached to the outside of sidewalls 12, 14, 16 and 18 at intervals as shown to prevent the mirrors from collapsing inward toward the collector axis CA. Square plywood plates with square holes, shown as elements 32, are also connected to the outside of the collector at intervals to prevent the mirrors from collapsing outward. The plastic mirrors are glued to the aluminum flashing (or plywood) with a material such as a spray glue. There is very little rippling of the plastic film material upon drying. Liquid glues are mostly water and not as appropriate for this application. Rubber cement has also been found acceptable. In combination, ziggurat elements 30 and 32 make a very rigid structure, even with quite flexible materials (such as the plastic mirrors), if they are supported on a small scale. For larger collectors, as one scales up the thickness of the collector sidewalls, the cost/watt stays constant inasmuch as the collected power increases at the same rate as the increase in collector cost. Other equipment construction methods can be devised within the spirit and scope of this invention; for example, replacing the outer plates that prevent outward collapse by strong tape (such as Gorilla-brand tape) bound around the outside of the collector.

FIG. 12 (*b*) is a photograph of an exemplary collector including a ziggurat-like support structure, showing the entrance face of the collector in this view. In formation, relatively thin plywood (quarter-inch, luan material) was used in the construction with the mirrored inner surfaces formed of extremely thin (5-10 mil) reflective film. The ziggurat structure provides an impressive degree of rigidity to a structure formed of relatively "thin" materials. FIG. 12(*c*) is a view of the same structure from the exit face. The thickness of the materials used for this exemplary arrangement are sufficient for a collector sized for residential purposes. Obviously, when designing larger collectors for industrial or larger-area applications, the thickness of the materials will scale accordingly (while still achieving collector efficiencies orders of magnitude better than conventional arrangements).

Figure 13A:
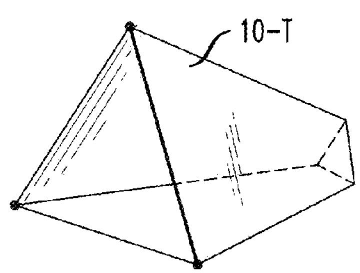
FIG. 13 shows different truncated pyramidal geometries which may be used to form solar collectors in accordance with the present invention.
Figure 13B:
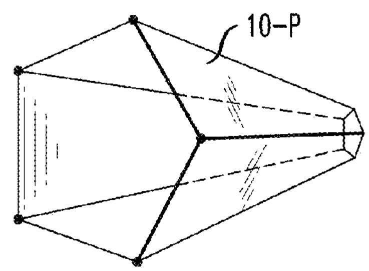
Figure 14A:
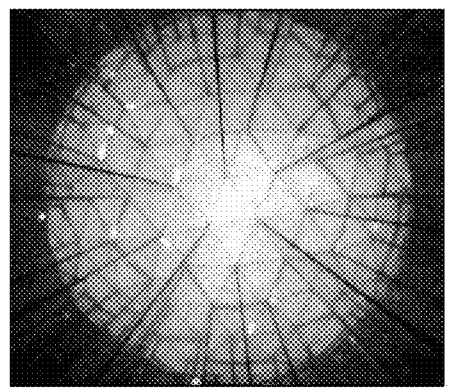
FIG. 14 depicts the Buckminster-Fullerene type images associated with the solar collector geometries of FIG. 13.
Figure 14B:
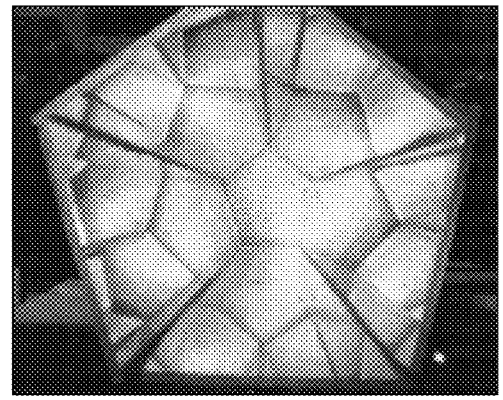

While the above discussion has been associated with the use of the collector geometry of FIG. 1(*a*), it is to be understood that the same principles apply to various other pyramidal collector geometries. FIG. 13 illustrate various other suitable arrangements, with FIG. 13(*a*) showing a simple triangular collector 10-T embodiment of the present invention. A truncated pentagonal pyramid solar collector 10-P is shown in FIG. 13(*b*). In each instance, a Buckminster-Fullerene type of solar image is created at the exit face of the collector, where FIG. 14(*a*) and 14(*b*) illustrate the images for the arrangements of FIGS. 13(*a*) and (*b*), respectively.

Figure 15:
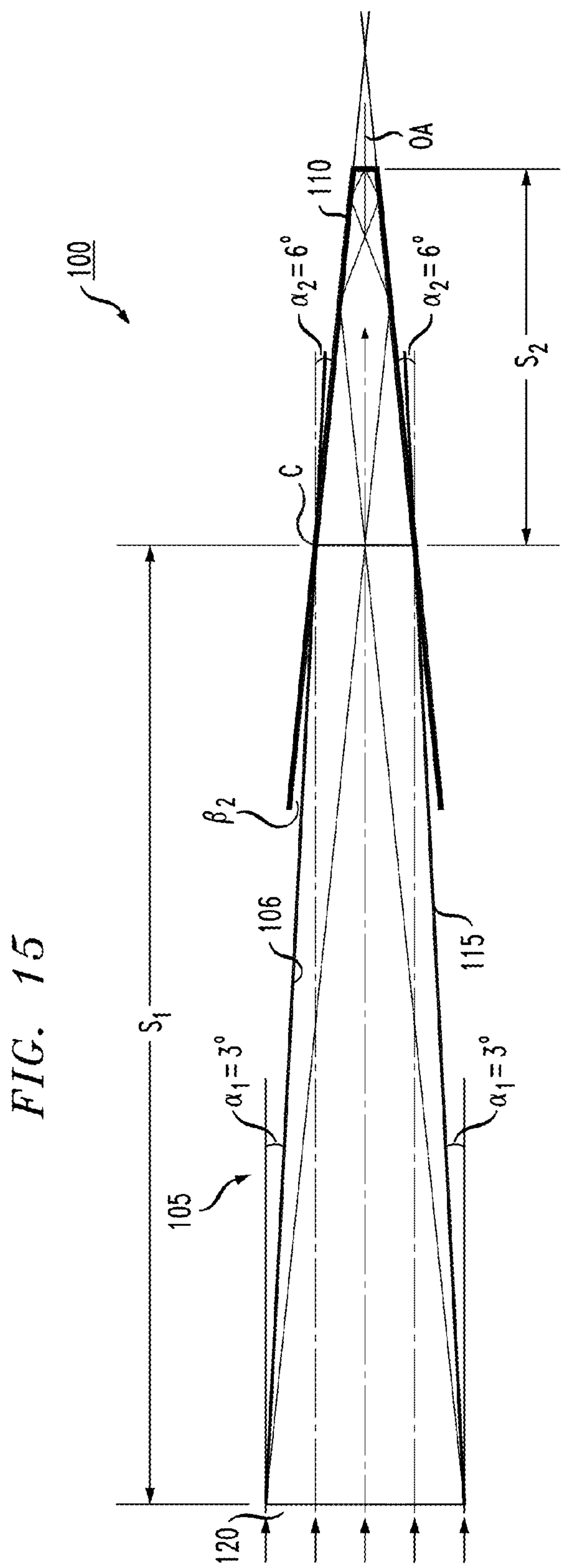
FIG. 15 illustrates an exemplary two-stage compound collector arrangement formed in accordance with the present invention.
Figure 16:
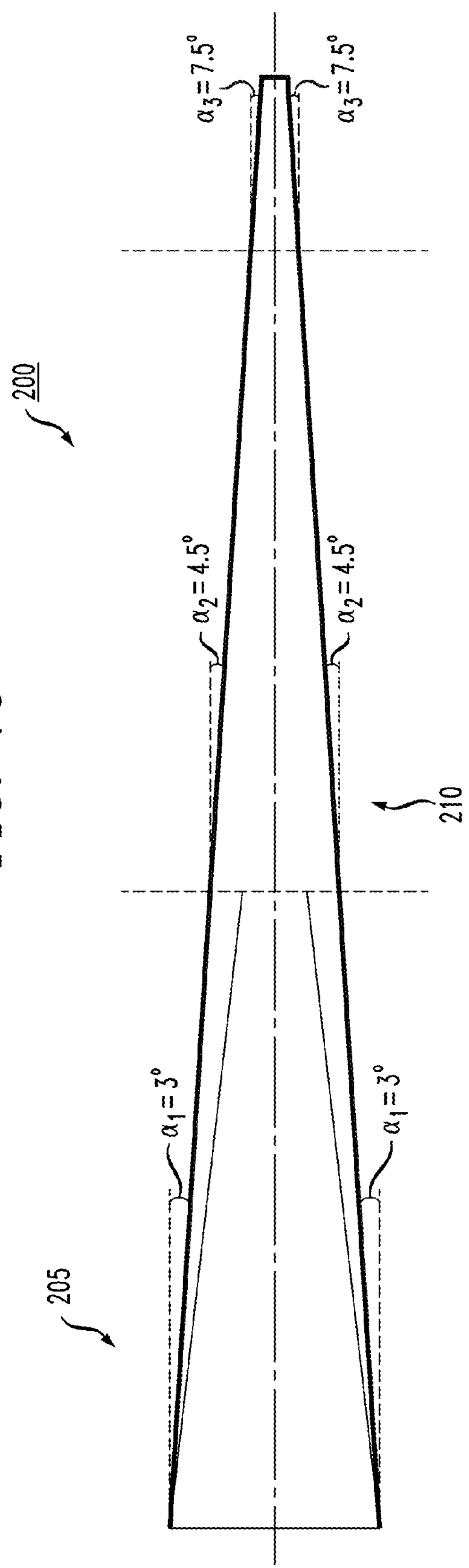
FIG. 16 illustrates an exemplary three-stage compound collector arrangement formed in accordance with the present invention.

As mentioned above, it is possible to extend the teachings of the present invention into a compound collector configuration—that is, a collector system comprising two or more collectors disposed in tandem and coaxially aligned. FIG. 15 is a side view of an exemplary two-stage collector system 100 formed in accordance with the present invention, and FIG. 16 is a side view of an exemplary three-stage collector system 200 formed in accordance with the present invention. Indeed, three-stage collectors can be assembled using the modified ziggurat construction technique described above for the two-stage arrangement.

Referring to the two-stage embodiment of FIG. 15, it is shown that collector system 100 comprises a first stage 105 and a second stage 110. In accordance with the present invention, the two stages are aligned in tandem along a common optical axis OA. Indeed, it is shown that first stage 105 is inserted within opening 115 of second stage 110. First stage 105 can be thought of as the "input" stage, with the incoming solar radiation entering an aperture 120 as shown. The solar rays then propagate along first stage 105, reflected by sidewalls 106 of first stage 105 as a function of the angle of the rays with respect to sidewalls 106. In this particular embodiment, first stage 105 is shown to a taper angle $\alpha_1$ of about 3° (not to scale) and an $L_1/D_1$ ratio of 2 (with an amplification factor $A_1$ of 4). The exit aperture of first stage 105 is shown as embedded within the opening 115 of second stage 100. In this example, second stage 100 has a taper angle $\alpha_2$ of about 6° and an $(L_2/D_2)$ ratio of 5 and an amplification factor $A_2$ of 25 (in this compound configuration, $D_1=L_2$). Overall, therefore, the compound collector of the present invention achieves amplification of 4×25 or 100. This benefit is achieved over the single stage arrangement, with the added advantage of increased insensitivity to input angle and a reduction in the number of reflections required for concentration. By reducing the necessary number of reflections, scattering losses are also significantly reduced.

Presuming that the arrangement of FIG. 15 is configured to have the same entrance and exit apertures as a single stage arrangement (such as shown in FIG. 2, for example), it will provide the same amplification factor. However, this amplification is achieved over a much shorter overall length than was required for a single stage arrangement. The advantages of a compound arrangement are thus obvious: smaller overall size, the need for fewer reflections (lower loss), larger acceptance angle, lower construction costs (including lower cost solar cells), higher efficiency for thermal energy production and lower land usage (the latter significantly increasing the viability of the arrangement for residential applications).

Moreover, compound solar collectors in accordance with the present invention may be designed with a smaller exit angle than possible with the single stage version described above. This means that second stage can be extended, or used to feed a third stage (such as shown in FIG. 16). Outputs with a very high amplification factor can therefore be achieved at a cost less than possible with a single stage arrangement.

In order to create a viable compound collector in accordance with this aspect of the present invention, the following criteria must be adhered to: a) the length of first stage 105 (shown as $S_1$ in FIG. 15) needs to be significantly shorter than the length S of the single stage collector described above for the same taper angle and entrance aperture size; b) taper angle $\alpha_2$ of second stage 110 needs to be greater than taper angle $\alpha_1$ of first stage 105 (in the example illustrated in FIG. 15, satisfied by the condition 6°>3°); c) the exit angle of first stage 105 is less than 90° with respect to optical axis OA; and d) acceptance angle $\beta_2$ of second stage 110 needs to be greater than the exit angle of first stage 105.

It is important to point out that the full value of concentration at the zone boundary cannot be achieved for the single collector embodiment of the present invention, as a result of the losses associated with multiple reflections. For example, at $\alpha a=3°$ in a single collector embodiment, there are about 16 reflections that occur as the rays traverse through the structure. For a reflectivity of 98% at normal incidence (a valid presumption), this corresponds to a total reflectivity loss of $(0.98)^{16}$, or about 0.72 (with an effective concentration, therefore, of 0.72×256=184). Moreover, not all of this light is useful, since some will exit at 90° and not impinge a solar cell (or thermal device). Estimating that the useful fraction of light collected is 85%, this yields a final result of 0.85 (184), or 156. In contrast, for an exemplary two-stage embodiment with $\alpha_1=3°$ and $\alpha_2=6°$, a total of only seven reflections will occur between the entrance and exit apertures. This yields a maximum reflectivity of $(0.98)^7$, or about 0.87. The maximum concentration is then (0.87)(9×36)=0.87×324=281—a significant improvement. Indeed, the two-stage collector is (281/156) or 1.8 times better than the single stage counterpart.

It is to be understood that for a plurality of N stages, each of these criteria is met for the complete system. Indeed, this is illustrated in the three-stage embodiment 200 shown in FIG. 16, including a first stage 205, a second stage 210 and a third stage 215. First stage 205 is formed to exhibit a taper angle $\alpha_1$ of 3°, with second stage 210 having a taper angle $\alpha_2$ of 4.5° and third stage 215 having a taper angle $\alpha_3$ of 7.5°. Again, these angles are not to scale in the drawing. The combination of three collectors forms an overall structure that only requires a series of five reflections, yielding a minimum reflectivity of $(0.98)^5$ or 0.90. As seen from the diagram of FIG. 16, the total amplification factor $A_{total}=A_1 \times A_2 \times A_3 9\times 9\times 9=729$, with a maximum exit angle (with respect to optical axis OA) of 55°. Thus, it is clear that this three-stage embodiment is fully capable of operating at angles that would otherwise be in the retroreflection region of the single collector embodiments described above.

Figure 17:
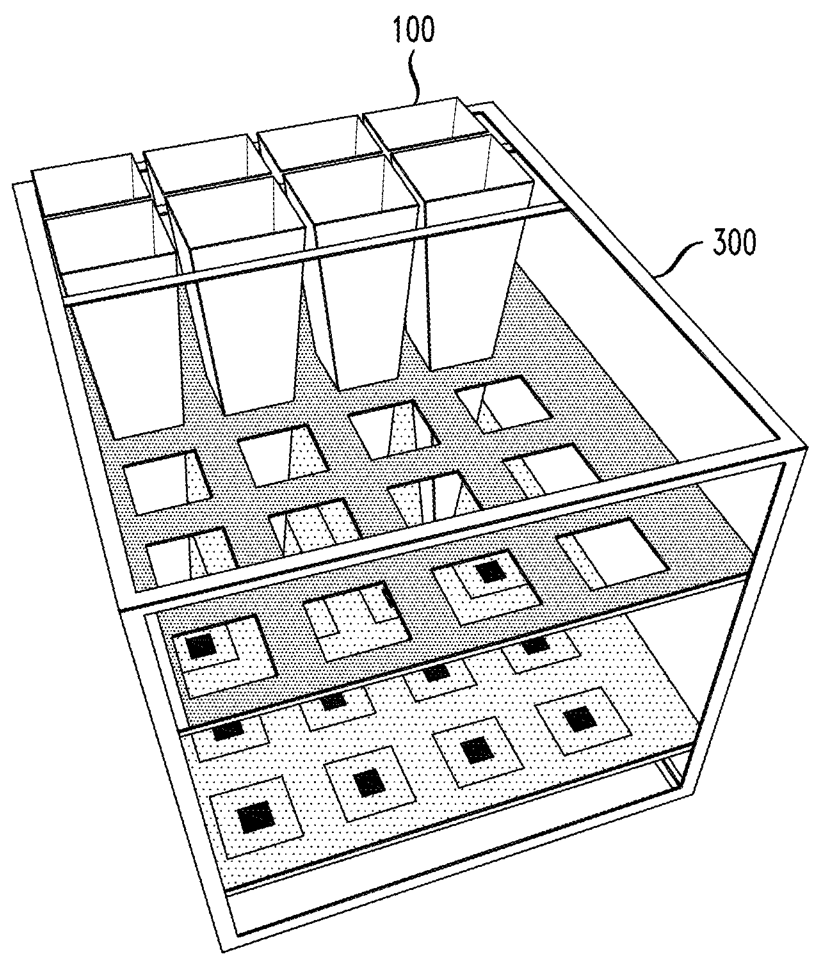
FIG. 17 illustrates an exemplary collector array, as held within a framework, in this case supporting a 4×5 array of compound collectors formed in accordance with the present invention.

It is clear from a review of both the two-stage and three-stage systems that there is much more freedom of design for compound collectors than for the single stage version described above. It is also possible to "stack" these compound collectors in an array system, as shown in FIG. 17. In this configuration, a 4×5 grouping of compound collectors (for example, a grouping of two-stage collectors 100) are disposed within a framework 300. While it remains necessary to track the sun's movement to some extent, the wide acceptance angle of the compound collector of the present invention is quite forgiving to some degree of misalignment.

Figure 18:
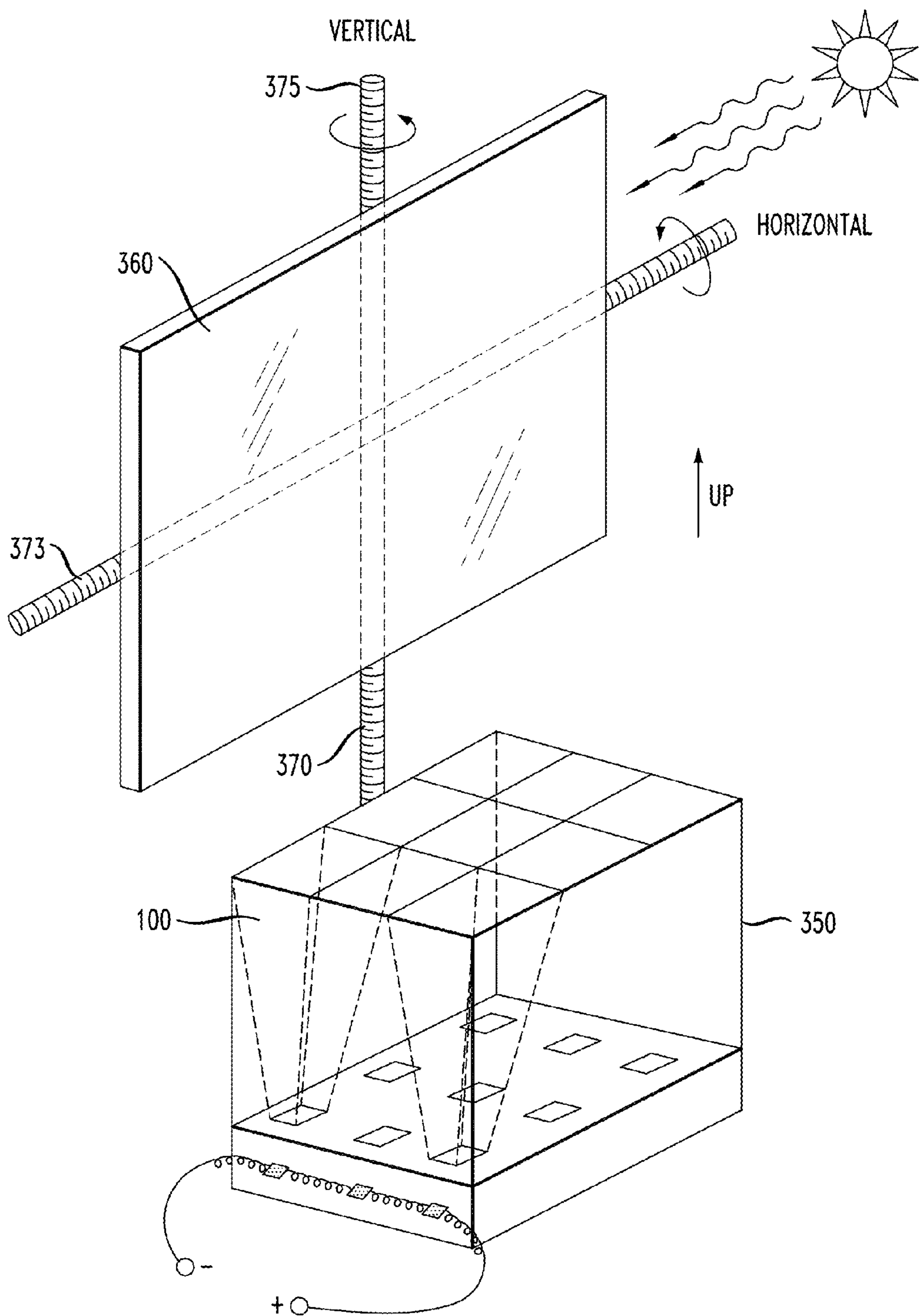
FIG. 18 illustrates an exemplary system utilizing the collector array of FIG. 17, in conjunction with a single mirror (controlled in both the horizontal and vertical directions) to completely fill the aperture of the array structure.

Advantageously, an array system of compound collectors as formed in accordance with the present invention may be configured to utilize a single reflecting surface to direct the incoming solar radiation so as to completely illuminate the entire array. FIG. 18 illustrates this principle, with a 3×3 array of two-stage collectors 100 disposed within a framework 350. A reflective member 360 (which may comprise a relatively inexpensive silver-foiled film) is attached to a support post 370 so as to extend above framework 350. Reflective member 360 is coupled to rotation elements 373, 375 to provide for both horizontal and vertical movement of reflective member 360. The rotation provides for the required tracking of the sun's movement (the tracking being considered relatively 'crude' compared to the precise tracking required for many prior art systems).

Although various preferred embodiments of the inventive solar collector have been shown and described, it will be appreciated by those skilled in the art that changes may be made to these embodiments without departing from the principles and the spirit of the invention, the scope of which is defined by the claims appended hereto.

What is claimed is:

1. A compound solar collector comprising a plurality of N truncated, right-angled pyramidal structures, each truncated, right-angled pyramidal structure having an entrance aperture of a first, larger area for accepting incoming solar radiation and an exit aperture of a second, smaller area, with each truncated, right-angled pyramidal structure exhibiting a collector axis defined between the center of the entrance aperture and the center of the exit aperture, each truncated, right-angled pyramidal structure further comprising a plurality of planar sidewalls disposed between said entrance aperture and said exit aperture and exhibiting highly reflective inner surfaces for creating multiple reflections of solar radiation therealong between said entrance aperture and said exit aperture, the multiple reflections creating a concentrated solar radiation output at said exit aperture, the plurality of sidewalls inwardly tapering between said entrance and exit apertures so as to create the multiple reflections at an increasing angle, the taper defining an angle a with respect to the collector axis, with each truncated, right-angled pyramidal structure having a length $S_i$, the plurality of N truncated, right-angled pyramidal structures disposed in tandem along a common optical axis and particularly configured such that the taper angles increase from an entrance truncated, right-angled pyramidal structure to an exit truncated, right-angled pyramidal structure, the taper angles including a first angle of about 3° associated with the entrance structure and a second angle of about 7.5° associated with the exit structure.

2. A compound solar collector as defined in claim 1 wherein the compound solar collector comprises a two-stage solar collector including a first stage truncated, right-angled pyramidal structure for accepting incoming solar radiation and exhibiting a taper angle of about 3° , and a second stage truncated, right-angled pyramidal structure for concentrating the radiation onto an output device, the second stage exhibiting a taper angle of about 6° .

3. A compound solar collector as defined in claim 1 wherein the compound solar collector comprises a three-stage solar collector including a first stage truncated, right-angled pyramidal structure for accepting incoming solar radiation, a second stage truncated, right-angled pyramidal structure coupled to receive the concentrated solar radiation output from the first stage, and a third stage truncated, right-angled pyramidal structure coupled to receive the concentrated solar radiation output from the second stage, further concentrating and directing an output concentrated radiation onto an output device.

4. A compound solar collector as defined in claim 3 wherein the first stage exhibits a taper angle of about 3° , the second stage exhibits a taper angle of about 4.5° and the third stage exhibits a taper angle of about 7.5° .

5. A compound solar collector as defined in claim 1, the collector comprising an array arrangement of the plurality of N truncated, right-angled pyramidal structures.

6. A compound solar collector as defined in claim 5 where the plurality of N truncated, right-angled pyramidal structures are fed by a single, on-axis mirror device without any feedback arrangement.

7. A compound solar collector as defined in claim 6 where the mirror device comprises a silver-foiled mirror device.

8. A compound solar collector as defined in claim 1 wherein the concentrated solar radiation is thereafter directed into a thermal energy receiver.

9. A compound solar collector as defined in claim 8 wherein the thermal energy receiver comprises a molten salt.

10. A compound solar collector as defined in claim 9 wherein the molten salt includes a plurality of black carbon particles to increase the thermal efficiency of molten salt.

11. A compound solar collector as defined in claim 10 wherein the molten salt is held in an insulated thermal energy storage container.

12. A compound solar collector as defined in claim 11 wherein the stored molten salt is used to actuate a scrubbing apparatus for removing contaminating $CO_2$ or other gases from the atmosphere.

* * * * *